United States Patent [19]
Dingwall

[11] Patent Number: 5,352,937
[45] Date of Patent: Oct. 4, 1994

[54] DIFFERENTIAL COMPARATOR CIRCUIT

[75] Inventor: Andrew G. F. Dingwall, Princeton, N.J.

[73] Assignee: RCA Thomson Licensing Corporation, Princeton, N.J.

[21] Appl. No.: 976,607

[22] Filed: Nov. 16, 1992

[51] Int. Cl.$^5$ .............................................. H03K 5/22
[52] U.S. Cl. .................... 307/355; 307/362; 307/272.3; 307/291; 307/494; 307/497; 307/530
[58] Field of Search .................. 307/272.2, 272.3, 289, 307/291, 279, 355, 494, 497, 530, 577, 584, 572, 362; 365/189.05, 205

[56] References Cited

U.S. PATENT DOCUMENTS

| | | | |
|---|---|---|---|
| 3,668,438 | 6/1972 | Cheney et al. | 307/279 |
| 3,767,945 | 10/1973 | Goser | 307/279 |
| 3,835,302 | 9/1974 | Au | 307/279 |
| 3,868,656 | 2/1975 | Stein et al. | 307/530 |
| 3,982,140 | 9/1976 | Lockwood | 307/279 |
| 3,992,704 | 11/1976 | Kantz | 307/530 |
| 4,028,557 | 6/1977 | Wilson | 307/362 |
| 4,107,556 | 8/1978 | Stewart et al. | 307/362 |
| 4,412,143 | 10/1983 | Patella et al. | 307/530 |
| 4,472,645 | 9/1984 | White | 307/279 |
| 4,603,403 | 7/1986 | Toda | 365/189.05 |

*Primary Examiner*—Timothy P. Callahan
*Assistant Examiner*—Terry D. Cunningham
*Attorney, Agent, or Firm*—Joseph S. Tripoli; Eric P. Herrmann; Ronald H. Kurdyla

[57] ABSTRACT

A differential comparator includes first and second transistors for comparing an input signal to a reference signal during a comparison phase and circuitry for balancing the quiescent currents through the transistors. The circuitry includes a first current source connected to the source of the first transistor, a second current source connected to the source of the second transistor and a selectively enabled impedance means connected between the sources of the two transistors. Prior to each comparison phase the currents through the first and second transistors are balanced (i.e. made approximately equal) by application of equal voltages to the gates of the two transistors and cross-coupling the source potentials of the first and second transistors to control the second and first current sources.

11 Claims, 4 Drawing Sheets

DIFFERENTIAL COMPARATOR CIRCUIT

BACKGROUND OF THE INVENTION

This invention relates to a differential comparator circuit and, in particular, to a differential comparator circuit which includes compensation for differences in the electrical characteristics of transistors forming the differential comparator.

Differential amplifiers are widely used as comparators. For example, the input stage of a standard differential amplifier comparator formed using insulated-gate field-effect transistors (IGFETs) normally includes first and second IGFETs having their source electrodes connected in common to a common current source and with an input signal applied to the gate of the first IGFET and a reference signal applied to the gate of the second IGFET. A problem arises in the use of the differential amplifier as a comparator if the responses of the first and second IGFETS are not equal and symmetrical. This is the case, for example, where the threshold voltages (i.e. the gate-to-source voltages, VGS, at low source-to-drain current) of the first and second IGFETs are different for the same bias conditions. Depending on which transistor has the larger threshold voltage, the input signal will appear to be greater or smaller than it actually is, resulting in an error.

This problem is very pronounced when the IGFETs used to form the comparator are thin film transistors (TFTs) made of amorphous silicon. The threshold voltages of TFTs or IGFETs made of amorphous silicon tend to be non-uniform due to processing and other factors and to shift or drift during operation when subjected to different stress potentials. As a result of these characteristics, amorphous silicon transistors would normally not be used to form a differential comparator. However, there are certain system applications where it is highly desirable and/or necessary to use such transistors. One of these applications relates to circuitry for driving liquid crystal displays. Amorphous silicon is a desirable technology for fabricating liquid crystal displays because this material can be fabricated at low temperatures which permits the use of standard, readily available, and inexpensive substrate materials.

The liquid crystal displays are normally composed of a matrix of pixels arranged in rows and columns. These pixels have to be driven by row and column drivers which are in turn driven by switching and control circuits. For purpose of economy of space and to reduce fabrication cost, it is preferable to simultaneously fabricate the control and switching circuitry driving the rows and columns of the liquid crystal display elements using the same technology used to form the liquid crystal display. Furthermore, it is desirable to form the control and switching circuitry around the periphery of the liquid crystal display at the same time as the liquid crystal display is formed. Therefore, there are compelling economic reasons (among others) for employing amorphous silicon transistors in the design of the control and switching circuitry including any comparator circuits.

As detailed below, applicant's invention is directed to a comparator circuit which includes compensation for differences and shifts in the threshold levels of the transistors forming the comparator. The compensation scheme of the invention enables an accurate comparator to be formed using transistors having non-uniform and/or varying characteristics, and may be formed using any known technology and may include IGFETs and/or bipolar transistors.

SUMMARY OF THE INVENTION

A comparator circuit embodying the invention includes a first transistor adapted to receive an input signal at its gate electrode, a second transistor adapted to receive a reference signal at its gate electrode, a third transistor having its conduction path connected between the source electrodes of the first and second transistors, and a current source means arranged to be selectively cross coupled across the third transistor to provide and autobalance bias current conducted by said first and second transistors.

BRIEF DESCRIPTION OF THE DRAWING

In the accompanying FIGURES, like reference characteristics denote like components.

DETAILED DESCRIPTION OF THE INVENTION

Circuits and systems embodying the invention may be formed using transistors made of amorphous silicon which have low mobility, low gain and non-uniform threshold voltages which drift with time and voltage stress. The use of such transistors is dictated by the need to fabricate cost effective scanning circuits using the same material as the components of a liquid crystal display panel of the type shown as 160 in FIG. 1 with which they are intended to operate. This feature enables the components of the system to be more easily integrated and manufactured more inexpensively.

Figure 1:
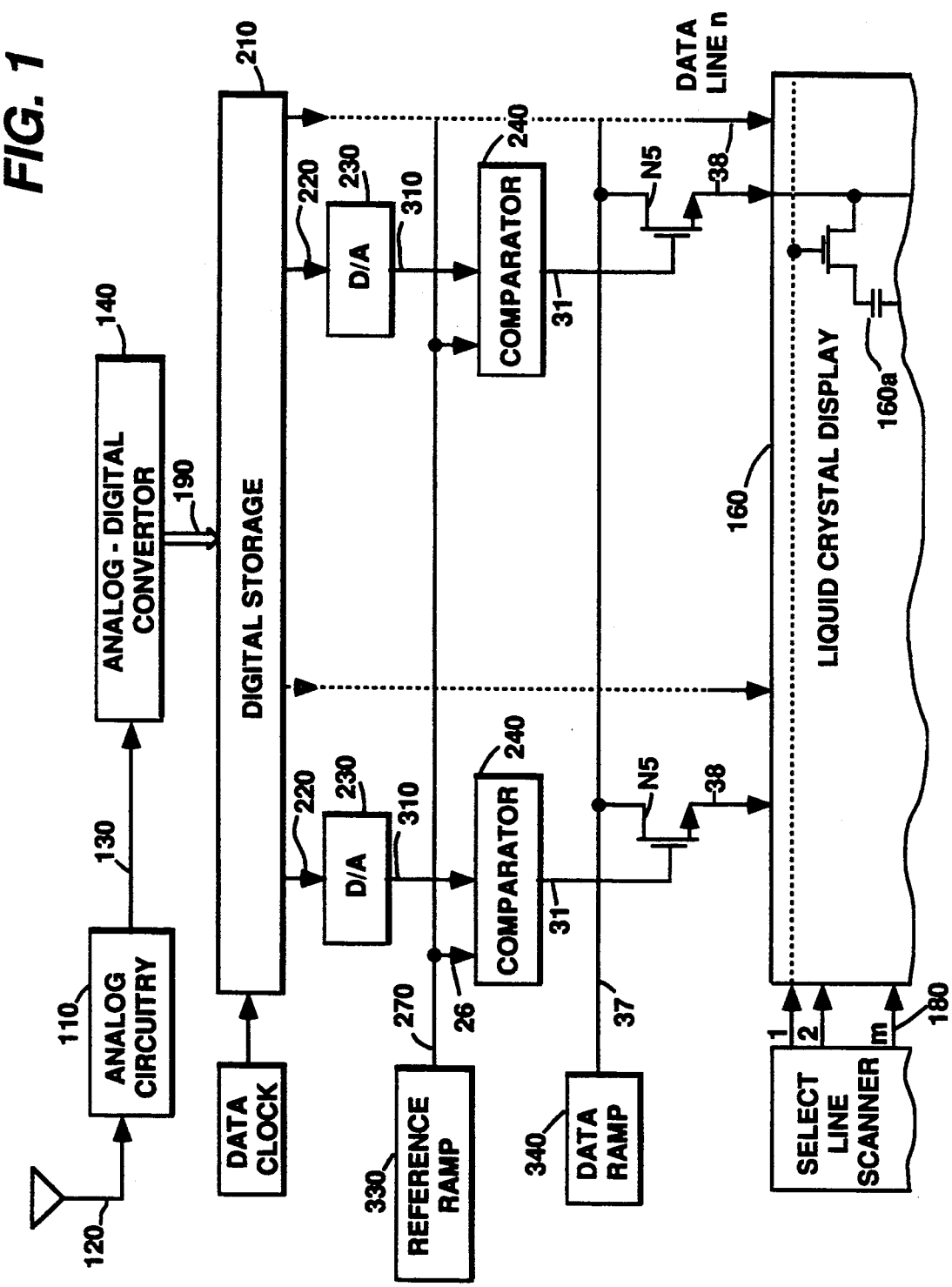
FIG. 1 is a block diagram of a system in which a comparator embodying the invention may be used.

For purpose of illustration, a comparator embodying the invention may be used in a system of the type shown in FIG. 1. In FIG. 1, analog circuitry 110 receives an analog information signal representative of the data to be displayed from an antenna 120. When the incoming signal is a television video signal, the analog circuitry 110 is similar to that of a standard television receiver of known type. However, the tube is replaced by a liquid crystal display device as described herein. The analog circuitry 110 provides an analog data bearing signal on a line 130 as an input signal to an analog-to-digital converter (A/D) 140.

The television signal from the analog circuitry 110 is to be displayed on a liquid crystal array 160 which is composed of a large number of pixel elements, such as the liquid crystal cell 160a, arranged horizontally in m rows and vertically in n columns. The liquid crystal array 160 includes n columns of data lines 38, one for each of the vertical columns of liquid crystal cells, and m select lines 180, one for each of the horizontal rows of liquid crystal cells.

The A/D converter 140 includes an output bus 190 to provide brightness levels or gray scale codes, to a digital storage means 210 having a plurality of output lines 220. The output lines 220 of the digital storage means 210 control the voltages applied to the data lines 38 for the columns of liquid crystal cells 160a through digital-to-analog converters (D/A) 230, comparators 240 and transmission gates N5. Each of the output lines 220 therefore controls the voltage applied to the liquid crystal cell in a particular column when an associated transmission gate N5 is conducting and in accordance with the scanning of the select lines 180. A display device using counters and a preferred embodiment of the digital storage means 210, in the form of a shift register, are described in U.S. Pat. Nos. 4,766,430 and 4,742,346 the teachings of which are incorporated herein by reference. A reference ramp generator 330 provides a reference ramp voltage signal on an output line 270 which is coupled to the respective comparators 240 in each of the columns of liquid crystal cells via a line 26. A data ramp generator 340 provides a data ramp to the columns of pixel elements by the connection of an output line 37 to each of the transmission gates N5. In FIG. 1, the transmission gates N5 are thin film transistors which are coupled to the outputs of the comparators 240 by lines 31.

In operation, digitized brightness signals from the digital storage means 210 are applied to the digital-to-analog converters 230, the output lines 310 of which are connected to one input of a comparator 240 by an output line 310. The reference ramp generator 330 supplies a reference ramp potential to the other input of each of the comparators 240 via lines 26. The reference ramp may be nonlinear to compensate for any nonlinearity generated in any part of the TV transmission, receiving system, or of the comparators 240. When the reference ramp voltage is lower (higher) than the brightness signal applied from the D/As 230, the potential on the output lines 31 of the comparators 240 are high(low) and the transmission gates N5 are conditioned to conduct(not-conduct). The voltages on the output lines 31 serve as the control signals for the transmission gates N5. The data ramp on the line 37 from the data ramp generator 340 is applied to every pixel element which is within the actuated row, arid which is associated with a turned on transmission gate N5. When the level of the reference ramp voltage reaches the level of the brightness signal from the D/A 230, the output line 31 of the comparator 240 goes low turning the associated transmission gate N5 off. The pixel element associated with the turned off transmission gate is therefore charged to the level established by the analog brightness signal from the D/A 230.

It is important that the comparators 240 respond accurately to the input signals. A comparator capable of accurate comparison even when the characteristics of the transistors forming the comparator are non-uniform and subject to shift is shown FIG. 2.

Figure 2:
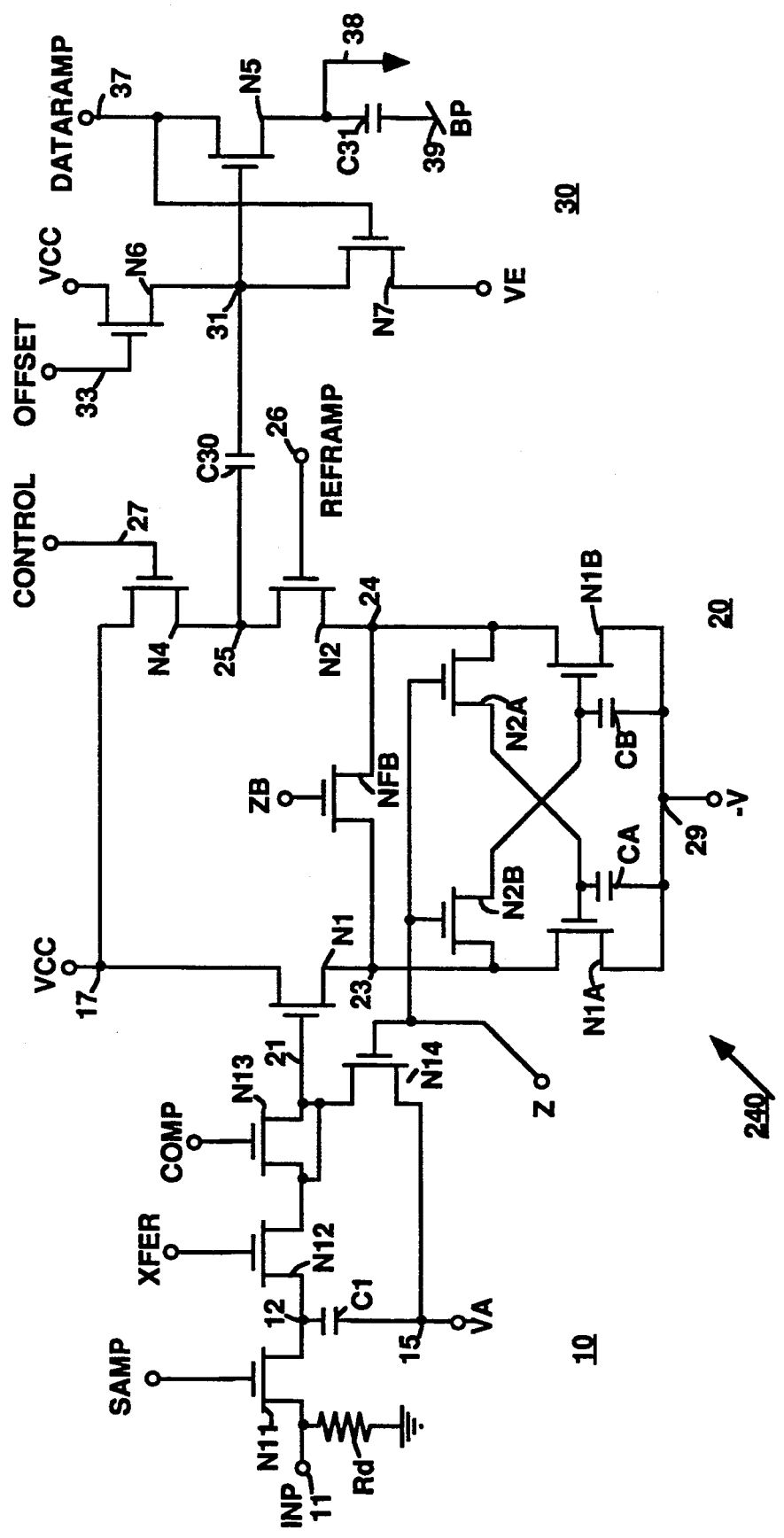
FIG. 2 is a schematic diagram of a comparator circuit embodying the invention.

Referring to FIG. 2, comparator 240 is shown to include an analog input signal sample and transfer stage 10, a differential comparator stage 20, and an output stage 30 for driving the column conductors of a liquid crystal display, such as the array 160 shown in FIG. 1.

Stage 10 functions to sample analog input signals (INP) present at an input terminal 11 and to selectively apply a sampled signal to input node 21 of the comparator stage 20. The amplitude of the analog input signals (INP) may range in value between zero volts and 10 volts as shown in waveform INP of FIG. 3. The INP signal may be a TV signal derived via line 310 from a D/A converter 230 as shown in FIG. 1 or any one of a number of known signal sources. A dummy resistor, Rd, which may, for example, have a value of 100k ohms is connected between terminal 11 and ground.

Figure 3:
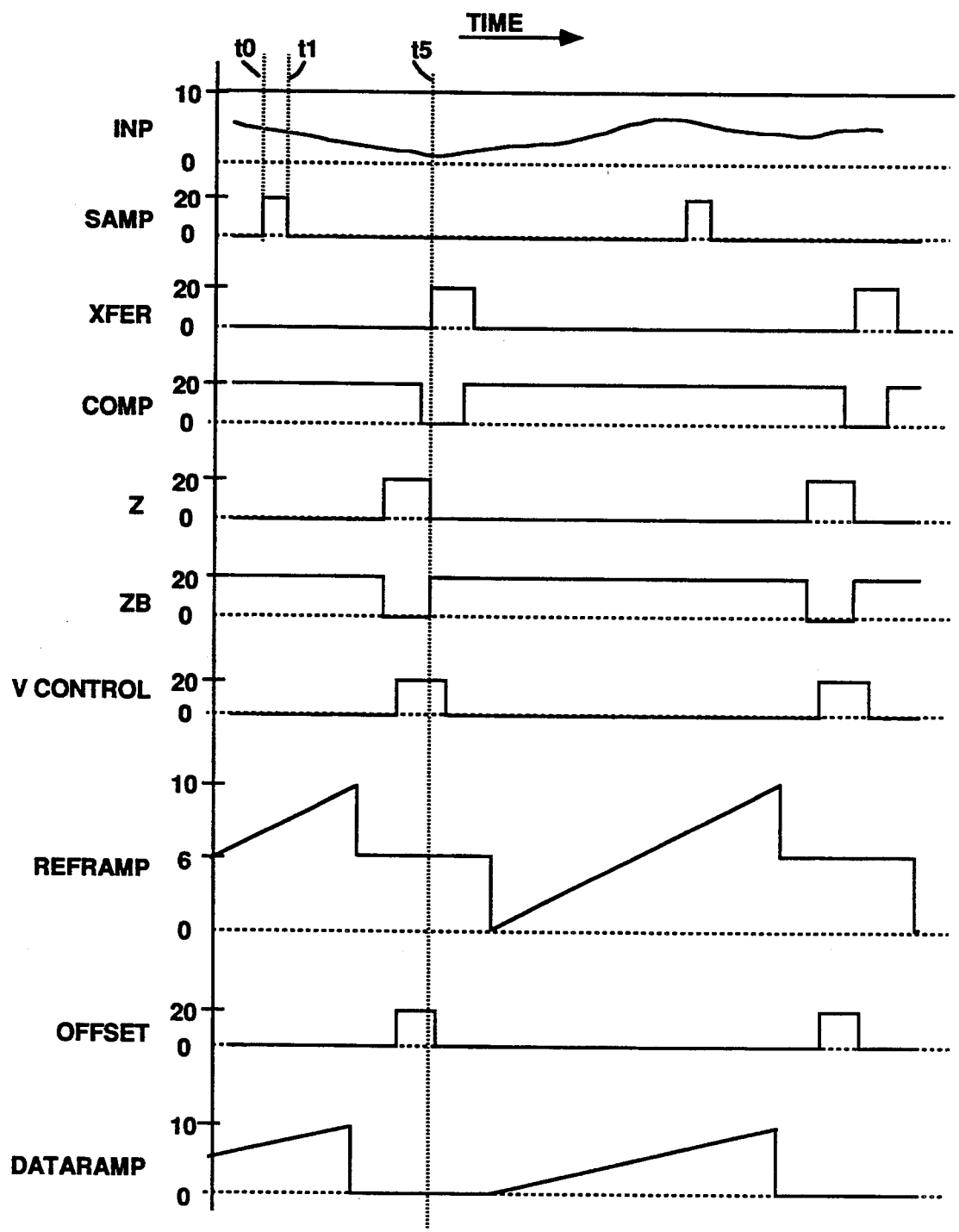
FIG. 3 is diagram of waveforms associated with the circuit of FIG. 2.

The conduction path of a sampling switching transistor N11 is connected between terminal 11 and a node 12. A sampling capacitor C1 having a capacitance of, for example, 1 picofarad (pf) is connected between node 12 and a terminal 15 to which is applied a fixed direct current (d.c.) voltage VA. In a particular design VA was set at 6 volts for reasons discussed below. A sampling signal (SAMP) of the type shown in waveform SAMP of FIG. 3 is applied to the gate of N11 to selectively sample the analog input signal (INP) and to charge C1 to the value of the INP signal. In a particular embodiment the SAMP signal includes a positive going pulse which goes from 0 volts to 20 volts during a sampling interval (e.g. t0–t1 in FIG. 3) and which may extend for a one (1) microsecond period.

The ON resistance of sampling switching transistor N11 is a function of the difference between the sampling voltage pulse (i.e., 20 volts) and the analog INP voltage (0 to 10 volts) applied to terminal 11. The sampling transistor N11 is overdriven with a sampling pulse of 20 volts to ensure that it is turned-on hard whereby its conduction path is driven to a relatively low impedance condition during each sampling interval. The time constant of the resistance of N11 and the capacitor C1 is designed to be sufficiently short to enable the capacitor C1 to be fully charged to the value of the INP input signal during each sampling interval (e.g., 1 microsecond).

The sampled signal stored on C1 is subsequently coupled to an input node 21 of differential comparator 20 via the conduction path of a transfer transistor N12 connected between node 12 and node 21. A transfer signal which includes a positive going transfer pulse (XFER) of 20 volts amplitude and having a pulse width of 1 to 2 microseconds, as shown in waveform XFER of FIG. 3, is applied to the gate electrode of N12 to selectively turn-it-on and to transfer the charge on C1 to the input node 21 of stage 20. The XFER pulse undesirably couples switching charge onto the gate capacitance associated with the input node 21 of the differential comparator. The parasitic capacitance of the input node is very low (e.g., 0.15 pf). The effect of the XFER pulse can be compensated by means of an out-of-phase COMP pulse of the type shown in waveform COMP of FIG. 3 which is applied to the gate of a device N13. Device N13 is a transistor whose source to drain path is shorted to node 21 to form a capacitor between node 21 and a terminal 13 to which is applied the compensating pulse. The conduction path of a transistor N14 is connected between node 21 and terminal 15. A Z-control signal which includes a positive going pulse as shown in waveform Z of FIG. 3 is applied to the gate of N14. When the Z-pulse is applied to the gate of transistor N14, it turns-on transistor N14 and causes a potential of VA volts to be applied to input node 21. The conduction of transistor N14 allows the initial precharging of C1 towards VA volts which speeds up the worst case analog input signal settling time.

The differential comparator stage 20 includes input terminal 21 to which is applied a sampled input signal (IN), a reference input terminal 26 to which is applied a reference input ramp signal (REFRAMP) of the type shown in waveform REFRAMP of FIG. 3 and an output terminal 25. Comparator 20 includes a first transistor N1 connected at its gate electrode to the input node 21, at its drain electrode to a power terminal 17 to which is applied VCC volts, which may for example, be equal to 20 volts, and at its source electrode to a node 23. A second transistor N2 is connected at its source electrode to node 24, at its drain electrode to output node 25 and at its gate electrode to terminal 26 to which is applied the REFRAMP signal. A feedback transistor NFB has its conduction path connected between nodes 23 and 24. A transistor N4 is connected at its source electrode to node 25, at its drain electrode to terminal 17, and at its gate electrode to a terminal 27 to which is applied a control signal (CONTROL) which includes a positive going pulse as shown in waveform CONTROL of FIG. 3. When the control signal (CONTROL) goes from zero volts to 20 volts it conditions the transistor N4 to charge the drain electrode of transistor N2 to a voltage which is close to VCC volts. This is done just prior to and coincident with the onset of each XFER pulse.

Transistors N1 and N2 are interconnected to form a differential amplifier which is modified to include means for substantially equilibrating the currents through N1 and N2 when substantially equal potentials are applied to their gate electrodes. Current balance in transistors N1 and N2 is established and maintained by circuitry which provides threshold correction and drift compensation to stage 20. The circuitry includes transistor N1A having its conduction path connected between node 23 and a power terminal 29 to which is applied a direct current (dc) operating voltage of, for example, −10 volts, and a transistor N1B having its conduction path connected between node 24 and terminal 29. The conduction path of a transistor N2A is connected between node 24 and the gate of N1A and the conduction path of a transistor N2B is connected between node 23 and the gate of N1B. A capacitor CA is shown connected between the gate of N1A and terminal 29 and a capacitor CB is shown connected between the gate of N1B and terminal 29. Capacitors CA and CB may be discrete capacitors or the integrated gate capacitances of N1A and N1B, respectively, and may for example have a value of 0.1 picofarad (pf). A control signal, Z, (see FIG. 3) is applied to the gate electrodes of transistors N2A and N2B, whereby they are concurrently placed in and out of conduction. A control signal ZB, which is the complement of the Z signal, (waveform ZB of FIG. 3), is applied to the gate electrode of transistor NFB. Consequently, when NFB is conducting N2A and N2B are non-conducting and vice-versa.

The differential amplifier 20 is alternately operated in an auto-balancing mode during an autobalancing time interval or phase, and in a signal comparing mode during a subsequent time interval or phase also denoted as the comparator phase.

During auto balancing, the Z pulse goes high and the ZB pulse is driven low. When ZB is "low", transistor NFB is turned-off and transistors N1 and N2 are isolated from each other. Concurrently, when Z is "high," the transistors N2A and N2B are conditioned to conduct and to couple the potentials V24 and V23 to the storage capacitors CA and CB respectively, thereby controlling the conduction of transistors N1A and N1B. In this condition the gates of N1A and N1B are cross-coupled to the sources of N2 and N1, respectively. Also during this period, like reference voltages (VF) are applied to the gates of N1 and N2. Since the input signal ranges from 0 to 10 volts it is desirable to auto-balance the differential amplifier 20 for a voltage which is close to, or slightly above, mid-range. By way of example, a reference voltage VF equal to 6 volts may be applied to the gates of N1 and N2 during autobalance. VA volts, which is equal to 6 volts in this example, is applied to the gate of transistor N1 via transistor N14 which is turned-on by the Z pulse going high. Concurrently the REFRAMP signal applied to the gate of N2 is driven to 6 volts. For this bias condition, the voltage V23 at the source of N1 is equal to VF (the potential applied to the gates of N1 and N2) minus VGS1, where VGS1 is the gate-to-source voltage drop of N1, and the potential V24 at the source of N2 is equal to VF minus VGS2; where VGS2 is equal to the gate-to-source voltage drop of N2. At low drain-to-source current the VGS of the respective transistors may be assumed to be approximately equal to their threshold voltage drop (VT). Although the VGS of the transistors changes with source-drain current (i.e., VGS increases with increasing current), for ease of discussion, reference will be had to the threshold voltage (VT1) of transistor N1 and the threshold voltage (VT2) of transistor N2 rather than the VGS of N1 and N2.

Thus, during the auto-balance interval the bias voltage applied to the gate of transistor N1A is VF−VT2 while the bias voltage applied to the gate of transistor N1B is VF−VT1. Assume, for example, that VT1 is greater than VT2 whereby, for example, VT1 is equal to 3 volts while VT2 is equal to 2 volts. Then, assuming VF to be equal to 6 volts, V23 is equal to 3 volts while V24 is equal to 4 volts. For Z high, the 3 volts at node 23 are applied to the gate of transistor N1B and stored on capacitor CB and the 4 volts at node 24 are applied to the gate of transistor N1A and stored on capacitor CA. Thus a voltage of +4 volts is applied to the gate of transistor N1A and a voltage of +3 volts is applied to the gate of transistor N1B. Transistors N1A and N1B function as current sources tending to pass a current which is a function of the amplitude of their gate voltages. For the threshold condition VT1=3v and VT2=2v, and in the absence of the cross coupled connection via transistors N2A and N2B, the current through transistor N1 would be less than the current through transistor N2 for equal gate voltages applied to transistors N1 and N2. Thus, a significant feature of the differential circuit 20 is that the voltage at the source of transistor N1 is cross-applied to the gate of transistor N1B while the voltage at the source of transistor N2 is cross-applied to the gate transistor N1A. The current through transistors N1A and N1 is controlled by the source voltage of transistor N2 while the current through current source transistors N1B and N2 is controlled by the source voltage of transistor N1. For the assumed example where V23 is 3 volts and V24 is 4 volts, the current sourced by transistor N1A will be greater than the current sourced by transistor N1B. As a result, the current through transistor N1 will tend to be greater than the current through transistor N2. That the circuit is overcompensated or overcorrected in that transistor N1 is caused to have greater conduction than transistor N2 although transistor N1 has a higher threshold voltage than transistor N2 and would normally conduct less than transistor N2. Hence, controlling the current source in the source leg of transistor N1 by sampling the voltage at the source of transistor N2, and controlling the current source in the source leg of transistor N2 by sampling the voltage at the source of transistor N1, results in an overcompensation for the differences in the threshold voltages of transistors N1 and N2 whether due to a parametric shift during operation or any other non-uniformity. The overcompensation is reduced by turning-on transistor NFB and inserting its conduction path between the sources of transistors N1 and N2.

At the end of the auto-balancing cycle the Z pulse goes low and the ZB signal goes high (e.g., see time 15 in FIG. 3). This causes transistors N2A and N2B to be turned-off and transistor NFB to be turned-on. However capacitors CA and CB remain charged to the respective voltage conditions (VF−VT2) and (VF−VT1) existing at nodes 24 and 23, during auto-balancing.

Figure 4:
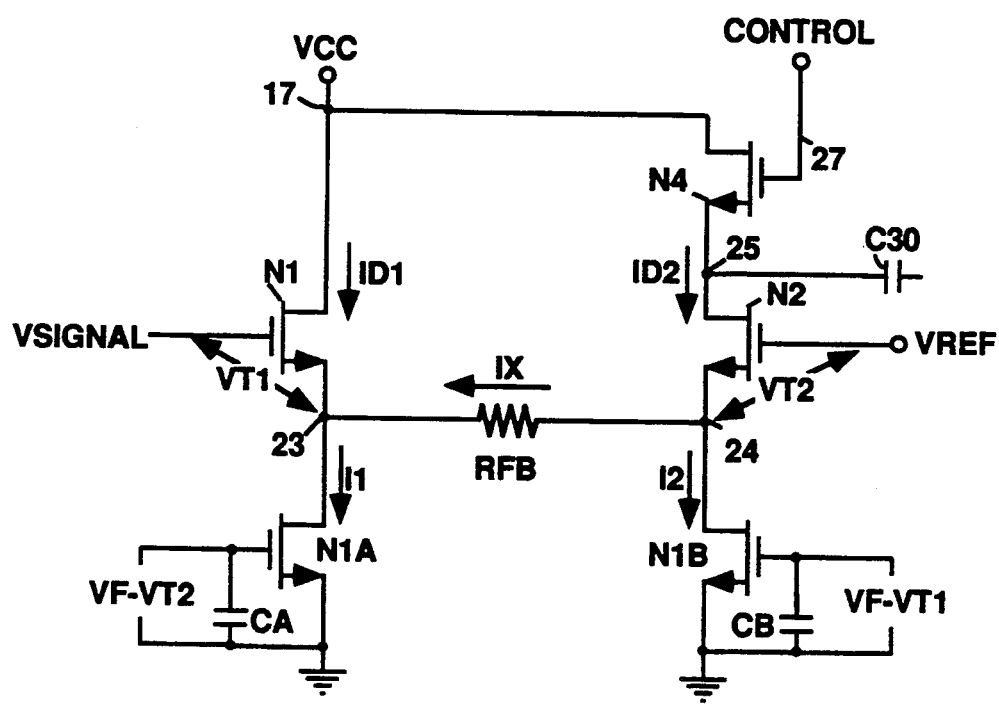
FIG. 4 is a simplified idealized representation of a portion of a comparator circuit embodying the invention.

When the auto-balancing interval terminates, pulse signal ZB goes high and the feedback transistor NFB is turned-on, providing a conduction path between nodes 23 and 24. The impedance of the conduction path of the transistor NFB tends to reduce the overcompensation by tending to equilabrate the currents conducted by transistors N1 and N2, for the same applied gate voltage. This can be demonstrated empirically by noting the following and by reference to FIG. 4 in which the impedance of transistor NFB is represented by a resistor RFB. If the impedance (RFB) of the conduction path of transistor NFB were to be made negligibly small (e.g., a short circuit) then the sources of transistors N1 and N2 would be held at the same voltage and there would be no compensation. That is, the transistor N1 or N2 having the lower threshold voltage would determine the voltage at the common source connection. On the other hand, if the impedance of the conduction path of transistor NFB is made very high (e.g., NFB is turned-off) then for different threshold voltages the conduction through N1 and N2 is overcorrected during autobalancing as described above. Assume, by way of example, that VT1=3 v and VT2=2 v and VF=6 v, resulting in 4 volts being applied to the gate of transistor N1A and 3 volts being applied to the gate of transistor N1B. Consequently the current I1 through transistor N1A is greater than the current I2 through transistor N1B. The conduction path of transistor NFB provides a current path between the sources of transistors N1 and N2 with conventional current flowing from the source which is at the higher potential (i.e., the one having the lower VT) to the source which is at the lower potential (i.e., the one having the higher VT). The potential drop across transistor NFB supports the difference in the source potentials of the differential transistors N1 and N2 commensurate with their threshold differences. Thus if the threshold potential of transistor N1 is x volts greater than the threshold potential of transistor N2, the voltage at the source of transistor N1 is established at x volts less than the potential at the source of transistor N2. Application of like potentials to the gate electrodes of the transistors N1 and N2 will therefore result in substantially equal currents being conducted by transistors N 1 and N2. The impedance of the conduction path of NFB is a function of its applied gate voltage, the voltage at nodes 23 and 24 and the size of NFB. The physical dimensions (or the conductivity) of transistor NFB will nominally be selected to be similar to the dimensions of transistors N1 and N2.

The output terminal 25 of the differential comparator stage 20 is coupled via an AC coupling capacitor C30 to output stage 30 which functions, for example, to drive the column conductors of a liquid crystal display. Capacitor C30 connected between output node 25 of the differential amplifier 20 and the input node. 31 of the output stage enables the bias levels of the output stage to be changed (shifted) without significantly altering the level bias and drive capability of the differential amplifier 20. A transistor N6 is connected at its source to node 31, at its drain to VCC volts, and at its gate to a terminal 33 to which is applied an OFFSET control signal. The OFFSET signal includes a positive going pulse (waveform OFFSET of FIG. 3) which causes transistor N6 to be turned-on momentarily concurrent with* transistor N4 being conditioned to couple voltage VCC to node 25. An output drive transistor N5, which performs the same function as transmission gate N5 of FIG. 1, has its gate electrode connected to node or line 31, its drain electrode connected to a terminal 37, to which is applied a DATARAMP signal (waveform DATARAMP of FIG. 3), and at its source to a column conductor 38 and one side of a capacitor C31 which represents the column bus capacitance. The other side of capacitor C31 is connected to a terminal 39 which represents the back plane of the liquid crystal display and to which is applied a fixed ground potential, VBP. A transistor N7 has its drain electrode connected to terminal 31, its gate electrode connected to terminal 35, and its source electrode connected to a terminal 41 to which is applied a potential VE. N7 is a small high impedance device designed to discharge the potential at the gate of transistor N5 when the potential on the drain of transistor N5 exceeds a desired range, thereby limiting the output potential provided by transistor N5.

The output stage 30 is operated in two modes, one mode being denoted as the positive mode and the other mode being denoted as the negative mode. Operation of the output stage is alternated between these two modes to cause cyclical reversal of the current through the liquid crystal display elements to extend their lifetime. During the positive mode: (a) VCC is equal to 20 volts; (b) the OFFSET signal is normally at, or close to zero volts and when pulsed goes to 20 volts; (c) the DATARAMP signal ramps up from zero volts to 15 volts; and (d) VE volts is set at zero volts. During the negative mode the bias signals and voltages noted above are shifted down by −8 volts. Thus: (a) VCC is set to 12 volts; (b) the OFFSET signal is normally at −8 volts and when pulsed goes to +12 volts; (c) the DATARAMP signal ramps up from −8 volts to +7 volts; and (d) VE volts is set at −8 volts. Furthermore during the negative mode the value of the input signal (INP) is inverted.

As noted above, AC coupling the output 25 of the differential amplifier 20 via C30 to the output stage 30 enables the output stage to the operated in the positive or the negative mode without upsetting the bias level at node 25 and to drive current in the liquid crystal display bidirectionally.

In the operation of the circuit of FIG. 2, during each auto-balancing phase the same voltage (e.g., 6 volts) is applied to the gates of transistor N1 and transistor N2, transistor NFB is turned-off and capacitors CA and CB are charged to the voltages at the sources of transistor N2 and transistor N1, respectively. Just prior to the termination of auto-balancing and the onset of a comparator phase a 20 volt CONTROL pulse is applied to the gate of transistor N4 and a 20 volt OFFSET pulse is applied to the gate of transistor N6. The CONTROL and OFFSET pulses cause node 25 to be charged to VCC minus the VT of N4 and node 31 to be charged to VCC minus the VT of transistor N6, respectively. With node 31 charged to (VCC-VT) volts, transistor N5 is conditioned to conduct coupling the DATARAMP signal at the drain of transistor N5 onto the column conductor at the source of transistor N5.

With the onset of a comparison phase, an input signal which may range in value between 0 and 10 volts is applied to the gate of transistor N1 under the control of a XFER pulse, and a REFRAMP signal which ramps up from 0 volts to 10 volts is applied to the gate of transistor N2. Assume, for example, that the input signal is equal to 5 volts. For values of the REFRAMP signal below 5 volts, transistor N1 conducts a current 2I and transistor N2 conducts little if any current. As the REFRAMP signal increases to a value close to the signal voltage at the gate of transistor N1 conduction through transistor N2 begins to increase. When the amplitude of the signal REFRAMP is equal to the signal voltage at the gate of transistor N1 the current, I2, through transistor N2 is then equal to the current, I1, through transistor N1 for the compensated condition. As the signal REFRAMP increases above the signal at the gate of transistor N1, conduction through transistor N2 increases. As transistor N2 conducts more heavily it quickly discharges capacitor C30 and node 31 lowering the potential on the gate of transistor N5, until transistor N5 is turned-off. Although transistor N5 is turned-off, the column conductor remains charged.

The circuit 30 responds in a similar fashion whether operated in the positive mode or the negative mode and need not be further detailed.

The invention has been illustrated with transistor N1 and transistor N2 being IGFETs. However it should be appreciated that the invention is also applicable to transistor N1 and transistor N2 being bipolar transistors.

What is claimed is:

1. A comparator comprising:
   first and second transistors, each transistor having first and second electrodes defining the ends of a conduction path and a control electrode and wherein a voltage applied between the control and first electrodes controls the conductivity of the conduction path;
   means for coupling the second electrode of the second transistor to an output terminal and for connecting the second electrode of the first transistor to a source of supply potential;
   means for applying signals to be compared to the control electrodes Of the first and second transistors;
   current source means for providing current to said first and second transistors including:
   first and second current sources arranged to provide current to the conduction paths of said first and second transistors respectively, and said first and second current sources having respective control electrodes;
   means for alternately coupling and decoupling the control electrodes of the first and second current sources to the first electrodes of the second and first transistors, respectively; and
   means for selectively coupling the first first and second transistors during intervals said control electrodes of the first and second current sources are not coupled to the first electrodes of the second and first transistors.

2. A combination comprising:
   first, second, third, fourth and fifth transistors, each transistor having drain and source electrodes defining the ends of a conduction path and a gate electrode;
   first and second power terminals;
   first and second signal input terminals;
   a signal output terminal;
   means connecting the drain of said first transistor to said first power terminal, its gate to said first signal input terminal and its source to a first node;
   means connecting the drain of said second transistor to said signal output terminal, its gate to said second signal input terminal, and its source to a second node;
   means connecting the conduction path of said third transistor between said first and second nodes;
   means connecting the conduction path of said fourth transistor between said first node and said second power terminal;
   means connecting the conduction path of said fifth transistor between said second node and said second power terminal;
   means for selectively coupling the gate of said fourth transistor to said second node and the gate of said fifth transistor to said first node; and
   a terminal connected to the gate electrode of said third transistor for applying a pulsed potential to selectively condition said third transistor to conduct.

3. The combination as claimed in claim 2 wherein said means for selectively coupling the gate of said fourth transistor to said second node and the gate of said fifth transistor to said first node includes a sixth transistor having its conduction path connected between the gate of said fourth transistor and said second node and a seventh transistor having its conduction path connected between the gate of said fifth transistor and said first node.

4. The combination as claimed in claim 3 wherein said means for selectively coupling the gate of said fourth transistor to said second node and the gate of said fifth transistor to said first node also includes means for applying a turn-on signal to the gates of said sixth and seventh transistors which is complementary to said pulsed potential to selectively said third transistor to conducts.

5. The combination as claimed in claim 4 further including an eighth transistor having its conduction path connected between said first power terminal and said signal output terminal, and having a gate electrode coupled to a control signal for selectively conditioning said eighth transistor to conduct during at least a portion of intervals that said sixth and seventh transistors are turned on.

6. The combination as claimed in claim 3 further including a ninth transistor having its drain connected to a third power terminal and its source to an output load terminal and capacitive means coupling said signal output terminal to the gate electrode of said ninth transistor.

7. The combination as claimed in claim 6 wherein said capacitive means includes a capacitor having one plate connected to said signal output terminal and its other plate connected to the gate electrode of said ninth transistor, and further including a tenth transistor having its conduction path connected between the gate of said ninth transistor and a point of operating potential having a value to turn-on said ninth transistor, and means for selectively applying a control signal to the gate of said tenth transistor for turning-it-on momentarily and charging the gate of said ninth transistor towards the potential of said operating potential.

8. The combination as claimed in claim 7 further including an eleventh transistor having a gate electrode connected to said third power terminal and having source and drain electrodes defining the ends of a conduction path connected between the gate of said ninth transistor and a point of reference potential having a value to turn-off said ninth transistor.

9. The combination as claimed in claim 2 further including means for selectively applying the same voltage to the gates of said first and second transistors during a first time interval and concurrently applying a turn-off signal to said third transistor and for enabling the means for selectively coupling during said first time interval.

10. A combination comprising:
   first, second, third, fourth and fifth insulated gate field effect transistors (IGFETs), each IGFET having drain and source electrodes defining the ends of a conduction path and a gate electrode;
   first and second power terminals;
   first and second signal input terminals;
   a signal output terminal;
   means connecting the drain of said first IGFET to said first power terminal, its gate to said first signal input terminal and its source to a first node;
   means connecting the drain of said second IGFET to said signal output terminal, its gate to said second signal input terminal, and its source to a second node;
   means connecting the conduction path of said third IGFET between said first and second nodes;
   means connecting the conduction path of said fourth IGFET between said first node and said second power terminal;
   means connecting the Conduction path of said fifth IGFET between said second node and said second power terminal;
   means coupled to the gate of the IGFET for selectively applying a turn-off voltage to the gate of said third IGFET during one period of time and concurrently applying a like valued turn-on voltage to the gates of said first and second IGFETs;
   means for selectively coupling potentials appearing at the first and second nodes to the gate electrodes of the fifth and fourth transistors respectively.

11. A comparator comprising:
   first and second signal input terminals for applying first and second signals to be compared;
   first, second, third, fourth and fifth insulated gate field effect transistors, each transistor having drain and source electrodes defining the ends of a conduction path and a gate electrode;
   means for serially coupling the conduction paths of the first and second transistors between positive and negative supply terminals, and connecting the gate electrode of the first transistor to said first signal input terminal;
   means for serially coupling the conduction paths of the third and fourth transistors between said positive and negative supply terminals, and connecting the gate electrode of the third transistor to said second signal input terminal;
   means for alternately coupling and decoupling the control electrodes of the second and fourth transistors to an interconnection of the third and fourth transistors and an interconnection of the first and second transistors respectively;
   means for connecting the conduction path of the fifth transistor between the interconnection of the third and fourth transistors and the interconnection of the first and second transistors and applying a potential for selectively conditioning the fifth transistor to conduct when said means for alternately coupling and decoupling is in a decoupling state and an output provided from the third transistor.

* * * * *

UNITED STATES PATENT AND TRADEMARK OFFICE
CERTIFICATE OF CORRECTION

PATENT NO. : 5,352,937

DATED : October 4, 1994

INVENTOR(S) : Andrew G. F. Dingwall

It is certified that error appears in the above-identified patent and that said Letters Patent is hereby corrected as shown below:

On the title page, Item [54] after "CIRCUIT" insert --WITH BALANCED QUIESCENT CURRENT--

On the title page, Item [56] after "U.S. PATENT DOCUMENTS ....
4,603,403  7/1986  Toda .................... 365/189.05"

Insert            --FOREIGN PATENT DOCUMENTS--

0,044,228  3/1980  Japan................. 307/291
2,262,171  7/1974  W. Germany............ 307/291
4,578,599  3/1986  Birch, et al.......... 307/272.2
3,657,570  4/1972  Brink................. 307/291

In Column 7, line 6, delete [15] and insert --t5--

In Column 8, line 9, after "with" delete [*]

In Column 8, line 22, after "to terminal" delete [35] and insert --37--

In Column 9, (Claim 1), line 45, after "to the" insert --respective--

In Column 9, (Claim 1), line 46, after "electrodes" delete [Of] and insert --of--

In Column 6, line 56, after "That" insert --is,--

UNITED STATES PATENT AND TRADEMARK OFFICE
CERTIFICATE OF CORRECTION

PATENT NO. : 5,352,937

DATED : October 4, 1994

INVENTOR(S) : Andrew G. F. Dingwall

It is certified that error appears in the above-identified patent and that said Letters Patent is hereby corrected as shown below:

In Column 9, (Claim 1) line 59, after "coupling the first" insert --electrodes of the--

In Column 10, (Claim 4) line 41, after "selectively" insert --condition--

In Column 10, (Claim 4) line 42, delete [conducts] and insert --conduct--

In Column 12, (Claim 10) line 1, after "gate of the" insert --third--

Signed and Sealed this

Tenth Day of October, 1995

Attest:

Attesting Officer

BRUCE LEHMAN

Commissioner of Patents and Trademarks